United States Patent [19]

Tateoka et al.

[11] Patent Number: 4,916,087
[45] Date of Patent: Apr. 10, 1990

[54] METHOD OF MANUFACTURING A SEMICONDUCTOR DEVICE BY FILLING AND PLANARIZING NARROW AND WIDE TRENCHES

[75] Inventors: Hidehisa Tateoka, Tenri; Shigeo Onishi, Nara; Masato Kawai, Tenri, all of Japan

[73] Assignee: Sharp Kabushiki Kaisha, Osaka, Japan

[21] Appl. No.: 400,013

[22] Filed: Aug. 29, 1989

[30] Foreign Application Priority Data

Aug. 31, 1988 [JP] Japan .................... 63-219505

[51] Int. Cl.⁴ ........................... H01L 21/82
[52] U.S. Cl. ..................... 437/67; 437/228; 437/229; 156/643; 156/646
[58] Field of Search ............. 437/67, 238, 240, 228, 437/229; 156/643, 646, 662; 148/DIG. 50, DIG. 25

[56] References Cited

U.S. PATENT DOCUMENTS 4,570,325 2/1986 Higuchi .................... 437/67

FOREIGN PATENT DOCUMENTS

57-204146 12/1982 Japan ....................... 437/72
61-26240 2/1986 Japan ....................... 437/72
61-256649 11/1986 Japan ....................... 437/67

Primary Examiner—Olik Chaudhuri
Attorney, Agent, or Firm—Sandler, Greenblum & Bernstein

[57] ABSTRACT

A method of manufacturing a semiconductor device includes the steps of (a) depositing a first insulating film by an isotropic deposition method over the entire surface of a semiconductor substrate which is provided with a narrow trench having an opening width in submicrons and a broad trench having an opening width larger than 1 μm so that the narrow and broad trenches are substantially filled with the first insulating film; (b) removing the first insulating film by an isotropic dry etching method; (c) depositing a second insulating film over the entire surface of the semiconductor substrate by an isotropic deposition method so that the narrow and broad trenches are substantially filled with the second insulating film; (d) forming a first resist layer on the broad trench filled with the second insulating film; (e) forming a second resist layer over the entire surface of the second insulating film and the first resist layer thereon; and (f) removing the first and second resist layers and the second insulating film by an anisotropic dry etching method until the surface of the semiconductor substrate is flattened.

7 Claims, 6 Drawing Sheets

METHOD OF MANUFACTURING A SEMICONDUCTOR DEVICE BY FILLING AND PLANARIZING NARROW AND WIDE TRENCHES

BACKGROUND OF THE INVENTION

1. Field of the Invention

The present invention relates to a method of manufacturing a semiconductor device and, more specifically, to a method which is employed in forming an element insulating portion by filling with an insulating material a narrow trench having an opening width in submicrons and provided in a semiconductor substrate and a broad trench having an opening width larger than 1 μm and provided in the same, and which is suitable particularly for isolation in a high density device applied to a dynamic RAM (DRAM).

2. Description of the Prior Art

Generally, in the process for manufacturing a high density device, a semiconductor substrate is provided with a narrow trench having an opening width K in submicrons and a broad trench having an opening width J larger than 1 μm for isolation between elements. Although the narrow trench is used as an isolation portion and the broad trench is used as a scribe line for isolation chips, they must be filled with a $SiO_2$ film by a chemical vapor deposition method (CVD).

In substantially filling the trenches, a BOX (Buried Oxide) method as shown in FIG. 5 is employed.

As shown in FIGS. 5 (a), (b) and (c), an $SiO_2$ film 4 is deposited by CVD over the entire surface of a Si substrate 1 which is provided with a narrow trench 2 having an opening width K of 1 μm and a broad trench 3 having an opening width J of several μm so that these trenches 2, 3 are filled with the $SiO_2$ film 4.

Then, a first resist layer 5 is formed on the $SiO_2$ film 4 deposited on the broad trench 3, and thereafter a second resist layer 6 is formed over the entire surface of the $SiO_2$ film 4 and the first resist layer 5 thereon (see FIG. 5 (d)).

After that, the first and second resist layers 5, 6 and the $SiO_2$ film 4 are etched back by an anisotropic dry etching method until the uppermost surface 1a of the Si substrate 1 is exposed and the surface of the semiconductor substrate 1 is flattened (see FIG. 5 (e)).

Figure 5A:
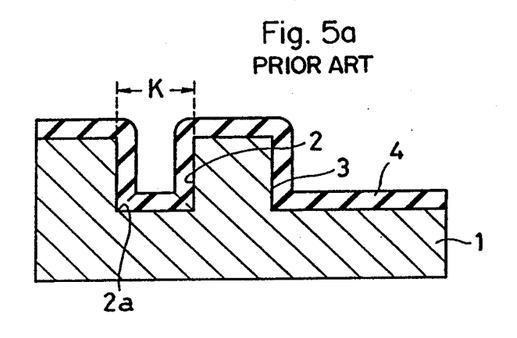
Figure 5B:
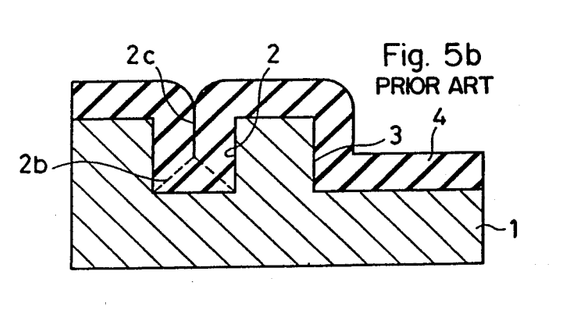
Figure 5C:
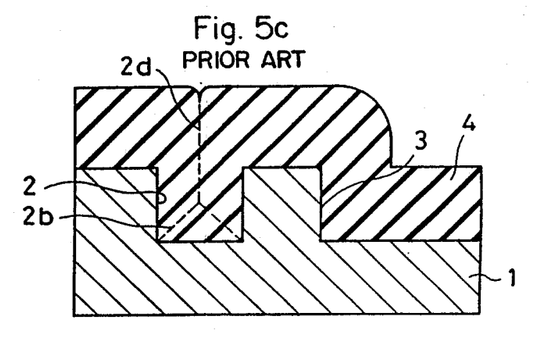
Figure 5D:
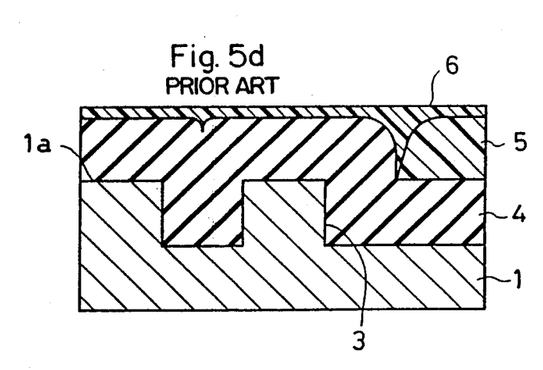
Figure 5E:
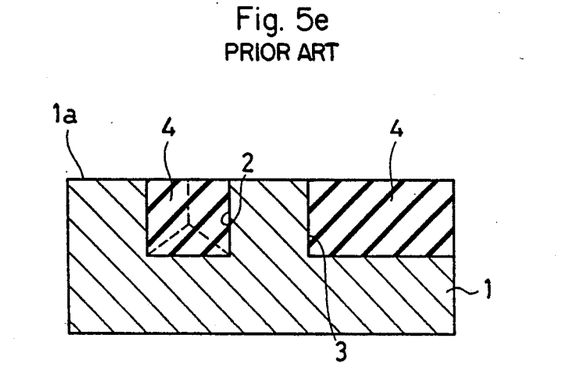

Thus, the narrow trench 2 and the broad trench 3 are filled with the $SiO_2$ film 4.

Then, the Si substrate 1 shown in FIG. 5 (e) is subjected to wet etching with HF bath. At this time, the $SiO_2$ film 4 in the narrow trench 2 is provided with a concave portion 7, or so called "nest", locally depressed along a contact face 2d in the middle portion of the narrow trench 2, of all contact faces 2a, 2b, 2c and 2d which are sequentially defined with growth of the film 4 as shown in FIGS. 5 (a), (b) and (c) (see FIG. 5).

Figure 5F:
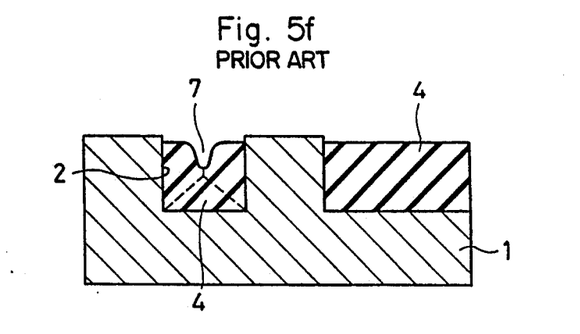

Thus, the surface of the substrate 1 lacks flatness. Accordingly, in subsequent device manufacturing steps, as some conductive material attaches to the concave portion 7, it is difficult to remove such conductive material from the narrow trench 2 when the substrate 1 is subjected to etching or washing. As a result, leakage between devices and short-circuiting between gates of the devices is likely to occur.

Taking the foregoing into consideration, the present invention can eliminate the disadvantages of manufacturing a semiconductor device by a BOX method.

SUMMARY OF THE INVENTION

Accordingly, it is an object of the present invention to provide a method of manufacturing a semiconductor device, comprising the steps of (a) depositing a first insulating film by an isotropic deposition method over the entire surface of a semiconductor substrate which is provided with a narrow trench having an opening width in submicrons and a broad trench having an opening width larger than 1 μm so that the narrow and broad trenches are substantially filled with the first insulating film; (b) removing the first insulating film by an isotropic dry etching method; (c) depositing a second insulating film over the entire surface of the semiconductor substrate by an isotropic deposition method so that the narrow and broad trenches are substantially filled with the second insulating film; (d) forming a first resist layer on the broad trench filled with the second insulating film; (e) forming a second resist layer over the entire surface of the second insulating film and the first resist layer thereon; and (f) removing the first and second resist layers and the second insulating film by an anisotropic dry etching method until the surface of the semiconductor substrate is flattened.

In accordance with the present invention, an element insulating portion is formed by a BOX method. The most significant characteristic of the present invention is the combined steps of an isotropic deposition, an isotropic dry etching, an isotropic deposition and etching back for flattening, whereby the narrow trench having a width in submicrons in the semiconductor substrate is filled with an insulating film.

In accordance with the present invention, well-known means are used for deposition and removing an insulating film and further flattening the same.

However, the inventors have found that the conventional disadvantage, that the semiconductor substrate must be subjected to wet etching with HF treatment although the insulating film in the narrow trench has in the middle portion of the trench a contact face easily etched by wet etching, can be eliminated by depositing an insulating film over the semiconductor substrate having narrow and broad trenches, by an isotropic deposition, removing the insulating film by an isotropic dry etching, depositing another insulating film by an isotropic deposition and then etching back to flatten the surface of the semiconductor substrate.

The present invention requires the additional new step of an isotropic dry etching and the succeeding step of an isotropic deposition for completely filling the narrow and broad trenches, compared to the conventional method. However, the aforementioned disadvantages can be eliminated by these steps. Thus, in accordance with the present invention, a device which has the least possibility of leakage between devices and short-circuiting between gates of the devices is advantageously provided.

BRIEF DESCRIPTION OF THE DRAWINGS

FIGS. 1 (a)–(h) illustrate manufacturing steps, which are presented to show an embodiment of the present invention;

FIG. 1 (h) is an h—h sectional view thereof;

FIGS. 4 (a)-(c) illustrate manufacturing steps, which are presented to show a comparison with the above embodiment; and FIGS. 5 (a)-(f) is a diagram illustrate manufacturing steps, which are presented to show a prior art embodiment.

DETAILED DESCRIPTION OF THE PREFERRED EMBODIMENT

A Si substrate is preferably employed for a semiconductor substrate in the present invention.

A $SiO_2$ film is preferably employed for first and second insulating films in the present invention.

The semiconductor substrate used in the manufacturing steps according to the present invention is provided with a narrow trench having an approximately 1 μm opening width K in submicrons ("submicron" is the unit of length below 1 μm) and a broad trench having an opening of approximately several·μm width larger than K.

Figure 3:
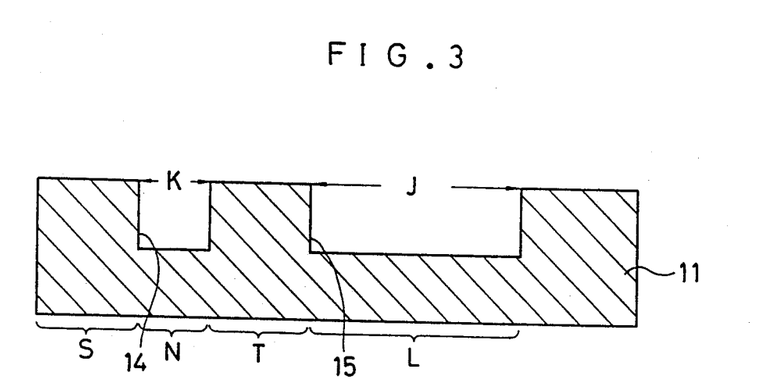
FIG. 3 is a diagram illustrating a construction of the positional relationship between narrow and broad trenches in a semiconductor.

The trenches can be made by known photolithography and reactive ion etching (RIE) techniques. A narrow trench 14 is made in a narrow element isolating region (N) and a broad trench 15 is made in a broad element isolating region (L) by depositing a photoresist film over the entire surface of the semiconductor substrate and thereafter subjecting the substrate to an anisotropic reactive ion etching using a mask (see FIG. 3). Both the narrow and broad trenches 14, 15 have a depth d together.

At the step (a), the first insulating film is deposited over the entire surface of the semiconductor substrate by means of an isotropic deposition. Now both the narrow and broad trenches are substantially filled, and the filling is effected by filling both the trenches 14, 15 with a $SiO_2$ film 16 completely to the bottom and further depositing the $SiO_2$ film 16 with a thickness P on the uppermost surface 11a of Si substrate 11, as shown in FIG. 1 (c).

The $SiO_2$ film 16 in the above case is isotropically deposited by means of CVD. Referring to FIG. 1 (c), in the narrow trench 14, the $SiO_2$ film 16 has contact faces 14a, 14b in corners and the middle portion thereof in an element isolating region (N) where the narrow trench 14 is defined. The $SiO_2$ film 16 in the contact faces 14a, 14b is easily etched by wet etching.

Then, a part of the first insulating film on the semiconductor substrate having both the trenches filled with the first insulating film is subjected to an isotropic dry etching at the step (b).

In the isotropic dry etching herein, a RIE is conducted in an atmosphere of a gas containing oxygen. The gas may be, for example, a mixture of 20% of a pure $O_2$ gas with 80% of a $CF_4$ gas. In subjecting a part of the first insulating film on the substrate to etching, pressure of the mixed gas may be 0.4 Torr, and applied electric power may be 400 W, for example.

By the isotropic dry etching as described above, the first insulating film is so removed that a part of the film remains in the trenches. The first insulating film in the narrow trench remains particularly having a sectional view as shown in FIG. 1 (d). In other words, referring to FIG. 1 (c), a part of the $SiO_2$ film 16 having a recessed portion 16a remains in the trench 14 as a result of the removal by which a sectorial part of the $SiO_2$ film 16 is removed having its radius r, its central angular θ and its center o. Therefore, the remaining portion 30 of the $SiO_2$ film in the narrow trench 14 has a concave surface an arc of which is l. In the figure, D designates a removed depth between the uppermost face of the substrate 11 and the middle point on the surface of the $SiO_2$ film.

Figure 4A:
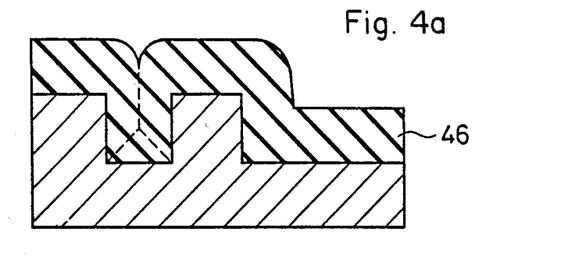
Figure 4B:
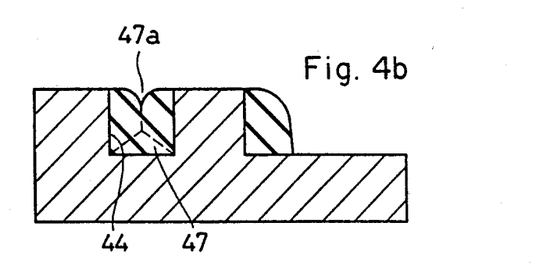
Figure 4C:
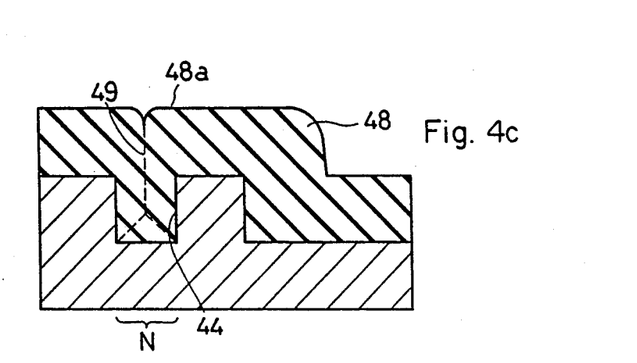

Assuming that a part of a first insulating film 46 shown in FIG. 4(a) is removed by an anisotropic dry etching instead of isotropic dry etching, a part 47 of the first insulating film 46 shown in FIG. 4(b) would remain having a concave portion 47a on its surface particularly in a narrow trench 44. Therefore, it could be a problem that, as shown in FIG. 4(c), a second insulating film 48 deposited all over the surface has a contact surface 49 up to the uppermost face 48a thereof in an element insulating region (N).

At the step (c), the second insulating film is deposited again over the entire surface of the semiconductor substrate by means of an isotropic deposition. Now both the narrow and broad trenches are substantially filled, and the filling is effected by completely filling with an $SiO_2$ film 17 a space which has been made during the previous step of isotropic dry etching, and further depositing the $SiO_2$ film 17 with thickness g on the Si substrate 11, as shown in FIG. 1(e).

At this time, the $SiO_2$ film 17 is deposited over the trenches 14, 15 without a contact face easily etched by wet etching, to completely fill those trenches 14, 15.

At the steps (d) and (e), the surface above the semiconductor substrate is flattened with first and second resist layers. This step is for preparing to etch back for flattening at the next step.

At the step (f), the surface of the semiconductor substrate is flattened. The step of etching back for flattening is effected by an anisotropic dry etching, for example. At this time, the first and second resist layers and the second insulating film are etched back at the common etching speed.

EXAMPLE

Figure 1A:
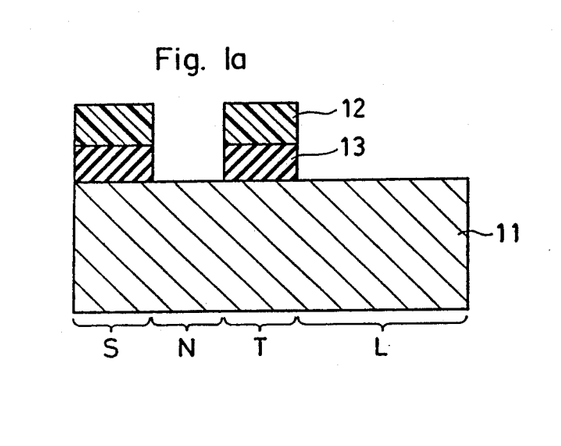
Figure 1B:
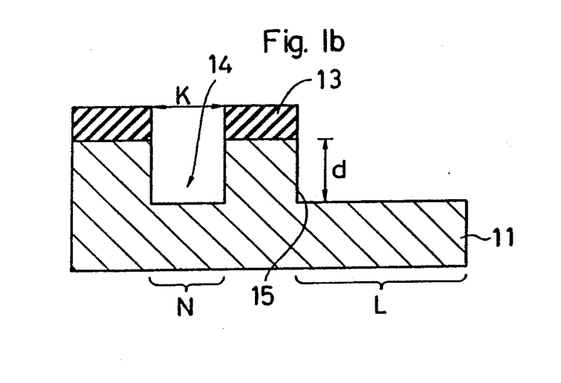
Figure 1C:
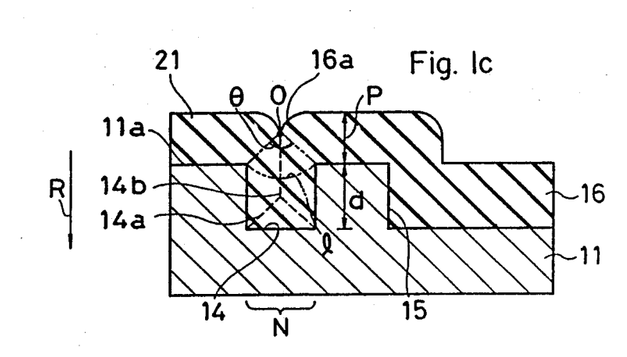
Figure 1D:
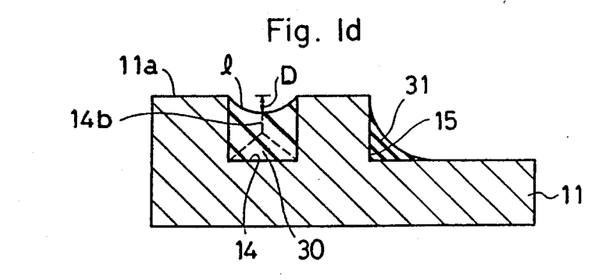
Figure 1E:
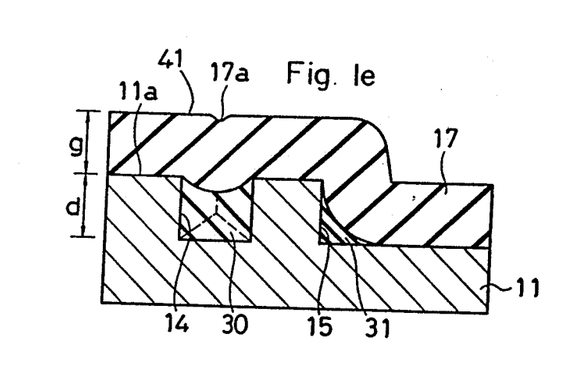

In FIG. 1(a), an $SiO_2$ film and a resist film are deposited over the entire surface of a Si substrate 11 by means of CVD or thermal oxidation one after another, and thereafter a resist film and a $SiO_2$ film are removed using a mask from the narrow and broad element isolating regions (N), (L) by RIE. As a result, a $SiO_2$ film 13 having a resist film 12 thereon is left in pre-element regions (S), (T). Further, after the remaining resist film 12 is removed, the Si substrate 11 is etched using the remaining $SiO_2$ film 13 as a mask by RIE, so that the narrow trench 14 having an opening width K of 1 μm is formed in the narrow element isolating region (N), and the broad trench 15 having an opening width J of several μm is formed in the large element isolating region (L) (see FIG. 1(b)). At this time, each of the trenches 14, 15 has a depth d of approximately 1 μm. After the remaining $SiO_2$ film 13 is removed, the first $SiO_2$ film 16 is deposited over the entire surface of the Si substrate 11 by CVD (FIG. 1(c)). At this time, the deposition of $SiO_2$ by CVD is continued until the narrow trench 14 is completely filled with $SiO_2$. The height P from the uppermost face 11a of the Si substrate 11 to the surface of the $SiO_2$ film 16 (i.e., the thickness of the $SiO_2$ film 16) is approximately 1 μm.

At this time, the $SiO_2$ film 16 has a concave portion 16a on its uppermost face 21 above the middle portion of the narrow trench 14. The $SiO_2$ film 16 has in the bottom corners of the narrow trench 14 the contact face 14a which is defined with the growing of $SiO_2$. It also has in the middle point of the narrow trench 14 the contact face 14b which covers from the concave portion 16a on its upper surface 21 to the lower portion of the $SiO_2$ film 16 of the narrow trench 14 (in the downward direction shown with an arrow R).

After that, the $SiO_2$ film 16 is etched back by isotropic dry etching until the thickness of the $SiO_2$ film 16 becomes about 500–1000 Å on the Si substrate 11 (see FIG. 1(d)).

At this time, the $SiO_2$ film 16 is removed about 1 μm by RIE by the isotropic dry etching. In this embodiment, a $SiO_2$ film 16 is removed about 1 μm by isotropic dry etching in an atmosphere containing 80% of $CF_4$ gas and 20% of $O_2$ gas on the condition of using a dry etching machine with 0.4 Torr in mixed gas pressure and 400 W in applied power. On this condition, a $SiO_2$ film 16 having a thickness of 1 μm is isotropically etched by a dry etching at the etching speed of 750 Å per minute. Accordingly, in this embodiment, the $SiO_2$ film 30 can be etched so that the surface of its remaining portion in the narrow trench 14 becomes concave. The amount of $SiO_2$ etched is controlled so that the length D of the removed portion is 1000–3000 Å between the uppermost face 11a of the Si substrate 11 and the middle point on the surface of the $SiO_2$. Meanwhile, in the broad trench 15, a part of an $SiO_2$ film 31 in contact with side and bottom walls of the trench 15 is left with a concave configuration.

As a result, the contact face 14b of the $SiO_2$ film 30 is removed by depth D from the uppermost surface 11a of the Si substrate 11.

Then, the second $SiO_2$ film 17 is deposited over the entire surface of the Si substrate 11 by CVD (see Fig. 1(e)). At this time, the thickness g of the film is as much as the depth d of the narrow and broad trenches 14, 15, approximately 1 μm. The $SiO_2$ film 17 has a small concave portion 17a in its uppermost surface 41 above and in the middle point of the narrow trench 14.

Figure 1F:
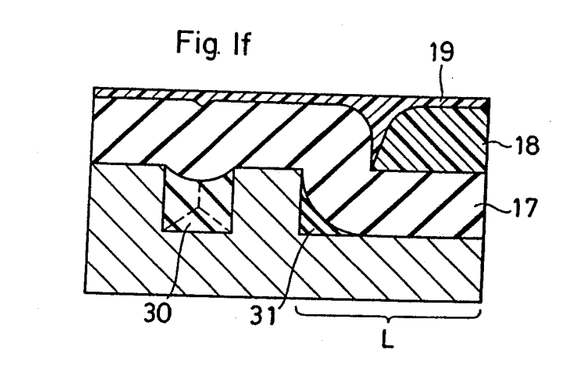

Then, a first resist film 18 is deposited on the $SiO_2$ film 17 in the broad element isolating region (L), and further a second resist film 19 is deposited over the entire surface of the $SiO_2$ film 17 and the first resist film 18 thereon to flatten the surface (see FIG. 1(f)).

Figure 1G:
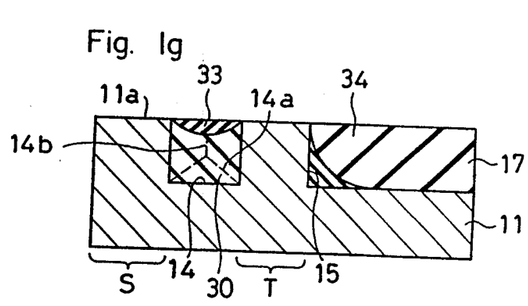

The first and second resist films 18, 19 and the $SiO_2$ film 17 are etched back by RIE at the etching speed common for all the films 18, 19 and 17 until the $SiO_2$ film 17 having a thickness of 500–1000 Å is left in the pre-element regions (s), (T) on the Si substrate 11 and until at last the uppermost surface 11a of the Si substrate 11 is exposed by wet etching with an HF bath (see FIG. 1(g)).

At this time, the narrow trench 14 is filled with the $SiO_2$ film 30 having the contact face 14b and an $SiO_2$ film 33 thereon having no contact face. On the other hand, the broad trench 15 is filled with the $SiO_2$ film 31 covering the side and bottom walls of the corners in the trench and an $SiO_2$ film 34 thereon.

Figure 1H:
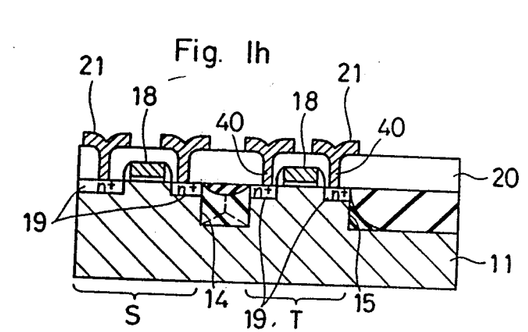
Figure 2:
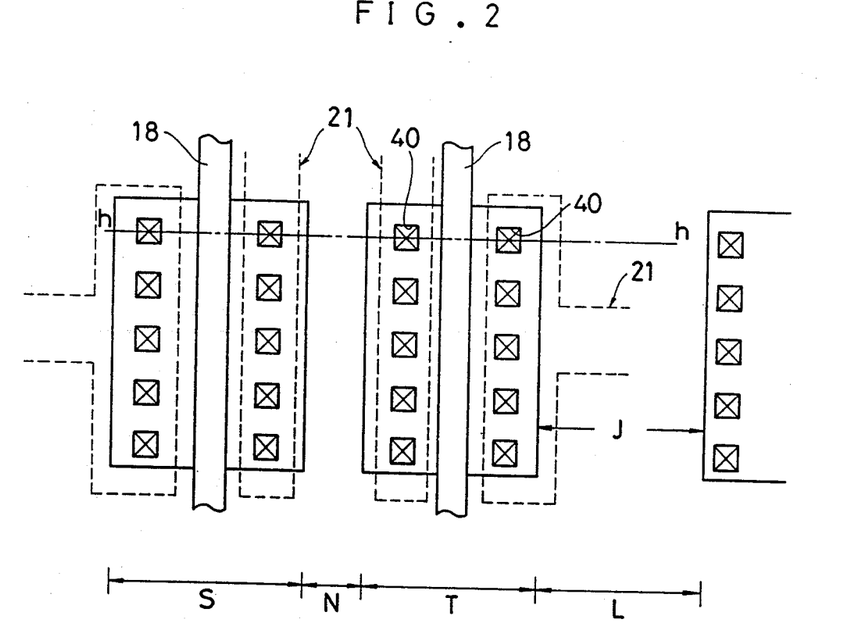
FIG. 2 is a schematic plan view illustrating a semiconductor device manufactured by an embodiment of the present invention.

After that, a MOS FET is made in the pre-element regions (S), (T) (see FIG. 1(h)).

At this time, the Si substrate 11 is subjected to HF treatment by wet etching with an HF bath. After the HF treatment, there is no possibility that the upper $SiO_2$ film 33 in the narrow trench 14 may be further etched into concavity by the HF bath as before because the $SiO_2$ film 33 has no contact face. After the completion of the HF treatment, a gate oxide film and a polysilicon film are deposited on the Si substrate 11 one after another. Thereafter, a gate electrode 18 is formed by photolithography. Further, an $n^+$ source-drain region 19 is formed in the pre-element regions (S), (T) by n-type ion injection to the Si substrate 11. Then, after an insulation film 20 of $SiO_2$ is deposited over the entire surface of the Si substrate 11, a contact hole 40 connecting to the source-drain region 19 is made, and a metal wire is installed through the contact hole 40. Thus, the MOS FET is manufactured (see FIG. 1(h)).

What is claimed is:

1. A method of manufacturing a semiconductor device, comprising the steps of
   (a) depositing a first insulating film by anisotropic deposition method over the entire surface of a semiconductor substrate which is provided with a narrow trench having an opening width in submicrons and a broad trench having an opening width larger than 1 μm so that said narrow and broad trenches are substantially filled with said first insulating film;
   (b) removing said first insulating film by an isotropic dry etching method;
   (c) depositing a second insulating film over the entire surface of said semiconductor substrate by an isotropic deposition method so that said narrow and broad trenches are substantially filled with said second insulating film;
   (d) forming a first resist layer on said broad trench filled with said second insulating film;
   (e) forming a second resist layer over the entire surface of said second insulating film and said first resist layer thereon; and
   (f) removing said first and second resist layers and said second insulating film by an anisotropic dry etching method until the surface of the semiconductor substrate is flattened.

2. A method according to claim 1, wherein said semiconductor substrate is a Si substrate.

3. A method according to claim 1, wherein said first and second insulating films are $SiO_2$ films.

4. A method according to claim 1, wherein said isotropic deposition is chemical vapor deposition.

5. A method according to claim 1, wherein said isotropic dry etching is effected by reactive ion etching.

6. A method according to claim 1, wherein said isotropic dry etching is effected in an atmosphere of a gas containing oxygen.

7. A method according to claim 6, wherein said gas containing oxygen is a mixture of 20% of pure $O_2$ gas with 80% of $CF_4$ gas.

* * * * *

UNITED STATES PATENT AND TRADEMARK OFFICE
CERTIFICATE OF CORRECTION

PATENT NO. : 4,916,087

DATED : April 10, 1990

INVENTOR(S) : H. TATEOKA et al.

It is certified that error appears in the above-identified patent and that said Letters Patent is hereby corrected as shown below:

Column 1, line 30, insert ---conventionally---after "is".
Column 3, line 22, insert ---J--- after "opening".
Column 6, line 23, in claim 1, line 3, change "anisotropic" to ---an isotropic---.

Signed and Sealed this

Eighteenth Day of August, 1992

Attest:

DOUGLAS B. COMER

*Attesting Officer*  *Acting Commissioner of Patents and Trademarks*